US010510593B2

(12) United States Patent
Sun et al.

(10) Patent No.: US 10,510,593 B2
(45) Date of Patent: *Dec. 17, 2019

(54) CONTACT OPENINGS AND METHODS FORMING SAME

(71) Applicant: Taiwan Semiconductor Manufacturing Company, Ltd., Hsinchu (TW)

(72) Inventors: Chih-Hung Sun, Hsinchu (TW); Han-Ti Hsiaw, Zhubei (TW); Yi-Wei Chiu, Kaohsiung (TW); Kuan-Cheng Wang, Toufen Township (TW); Shin-Yeu Tsai, Zhubei (TW); Jr-Yu Chen, Taipei (TW); Wen-Cheng Wu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/870,058

(22) Filed: Jan. 12, 2018

(65) Prior Publication Data

US 2018/0151425 A1 May 31, 2018

Related U.S. Application Data

(63) Continuation of application No. 15/462,001, filed on Mar. 17, 2017, now Pat. No. 9,881,834.

(Continued)

(51) Int. Cl.
*H01L 21/768* (2006.01)
*H01L 21/321* (2006.01)
(Continued)

(52) U.S. Cl.
CPC .. *H01L 21/76877* (2013.01); *H01L 21/02532* (2013.01); *H01L 21/02592* (2013.01);
(Continued)

(58) Field of Classification Search
CPC ............ H01L 21/31144; H01L 21/266; H01L 21/311; H01L 21/32133; H01L 21/3213; H01L 21/76877
See application file for complete search history.

(56) References Cited

U.S. PATENT DOCUMENTS 7,667,271 B2   2/2010   Yu et al.
7,910,453 B2   3/2011   Xu et al.
(Continued)

FOREIGN PATENT DOCUMENTS

CN   102569180 A   7/2012
KR   20070000659 A   1/2007

*Primary Examiner* — Thanhha S Pham
(74) *Attorney, Agent, or Firm* — Slater Matsil, LLP

(57) ABSTRACT

A method includes performing an implantation on a portion of a first layer to form an implanted region, and removing un-implanted portions of the first layer. The implanted region remains after the un-implanted portions of the first layer are removed. An etching is then performed on a second layer underlying the first layer, wherein the implanted region is used as a portion of a first etching mask in the etching. The implanted region is removed. A metal mask is etched using the second layer to form a patterned mask. An inter-layer dielectric is then etched to form a contact opening, wherein the patterned mask is used as a second etching mask.

20 Claims, 16 Drawing Sheets

Related U.S. Application Data

(60) Provisional application No. 62/427,435, filed on Nov. 29, 2016.

(51) Int. Cl.
*H01L 21/311* (2006.01)
*H01L 21/02* (2006.01)
*H01L 21/265* (2006.01)
*H01L 21/266* (2006.01)
*H01L 21/3205* (2006.01)
*H01L 21/3213* (2006.01)
*H01L 21/8234* (2006.01)

(52) U.S. Cl.
CPC ...... *H01L 21/266* (2013.01); *H01L 21/26533* (2013.01); *H01L 21/31144* (2013.01); *H01L 21/32053* (2013.01); *H01L 21/32133* (2013.01); *H01L 21/76829* (2013.01); *H01L 21/823475* (2013.01)

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,881,834 B1 * | 1/2018 | Sun .................. H01L 21/02592 |
| 2007/0049052 A1 * | 3/2007 | Baier .................. H01L 21/0337 438/780 |
| 2009/0033362 A1 * | 2/2009 | Manger .............. H01L 21/0332 326/52 |
| 2011/0207329 A1 | 8/2011 | Shih et al. |
| 2013/0203247 A1 * | 8/2013 | Hsieh .................. H01L 21/28035 438/488 |
| 2013/0240952 A1 | 9/2013 | Wong et al. |
| 2014/0001574 A1 | 1/2014 | Chen et al. |
| 2014/0110755 A1 | 4/2014 | Colinge |
| 2014/0151812 A1 | 6/2014 | Liaw |

* cited by examiner

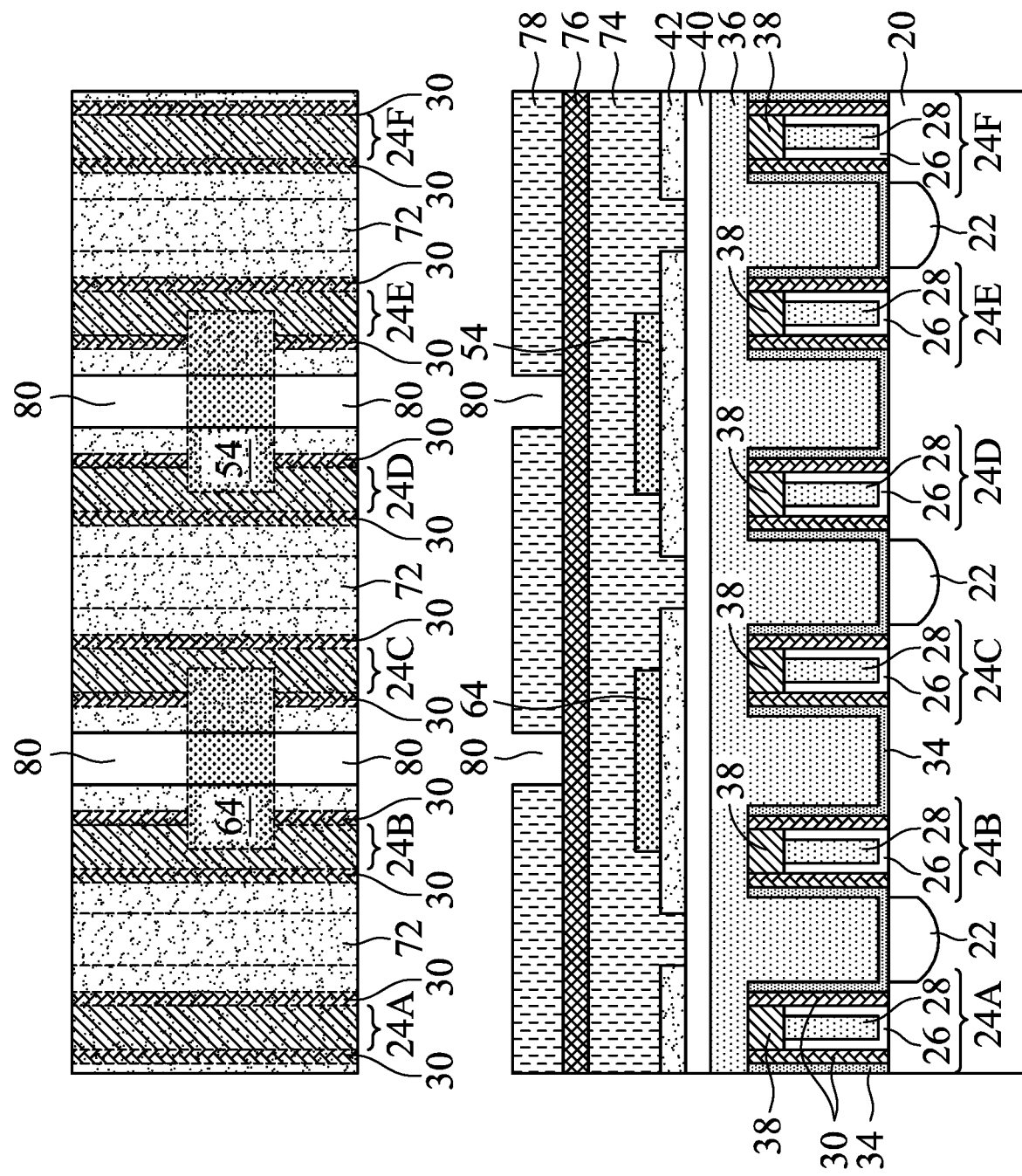

CONTACT OPENINGS AND METHODS FORMING SAME

PRIORITY CLAIM AND CROSS-REFERENCE

This application is a continuation of U.S. patent application Ser. No. 15/462,001, entitled "Contact Openings and Methods Forming Same," filed on Mar. 17, 2017, now U.S. Pat. No. 9,881,834 issued on Jan. 30, 2018, which application claims the benefit of the following provisionally filed U.S. Patent Application Ser. No. 62/427,435, filed Nov. 29, 2016, and entitled "Using Implanted Layers to Define Hard Masks for Forming Contact Openings," which applications are hereby incorporated herein by reference.

BACKGROUND

In the manufacturing of integrated circuits, contact plugs are used for connecting to the source and drain regions and the gates of transistors. The source/drain contact plugs are typically connected to source/drain silicide regions, whose formation process includes forming contact openings in an inter-layer dielectric, depositing a metal layer extending into the contact openings, and then performing an anneal to react the metal layer with the silicon/germanium of the source/drain regions. The source/drain contact plugs are then formed in the contact openings.

In conventional processes for forming the contact openings, the positions of the contact openings are defined by titanium nitride masks, and a photo resist is formed over the titanium nitride masks. The photo resist and the titanium nitride masks are in combination used as an etching mask to etch the inter-layer dielectric and to form contact openings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 14 are top views and cross-sectional views of intermediate stages in the formation of transistors and corresponding contact plugs in accordance with some embodiments.

DETAILED DESCRIPTION

Figures 1A, 1B:
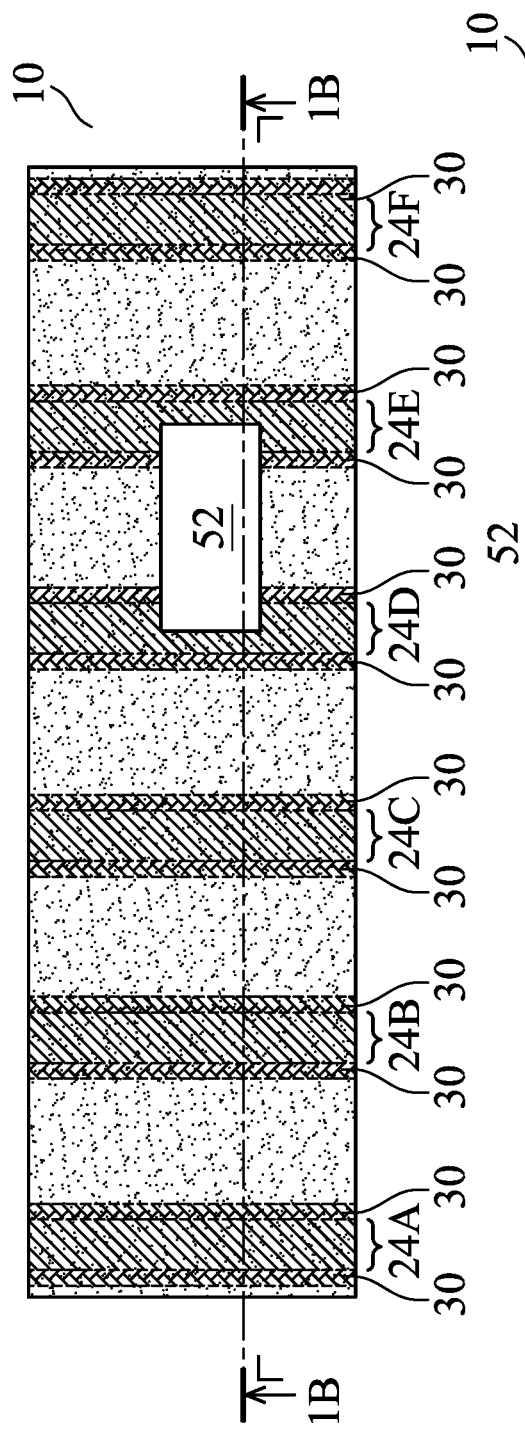

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors, contact plugs of transistors, and the methods of forming the same are provided in accordance with various exemplary embodiments. The intermediate stages of defining and forming the contact plugs are illustrated. The variations of some embodiments are discussed. Throughout the various views and illustrative embodiments, like reference numbers are used to designate like elements. The steps shown in FIGS. 1A through 14 are also illustrated schematically in the process flow 200 shown in FIG. 15. Some of figures may be numbered by a digit(s) followed by letter "A" or "B," wherein the figures with numbers having letter "A" illustrate top views, and the figures with numbers having letter "B" illustrate cross-sectional views. Furthermore, the figures with the same numbers (but differ from each other in letters) illustrate the same structure.

FIGS. 1A through 14 are top views and cross-sectional views of intermediate stages in the formation of a transistor and the respective contact plugs in accordance with some exemplary embodiments. FIGS. 1A and 1B illustrate a top view and a cross-sectional view, respectively, of the formation of an initial structure. Referring to FIG. 1B, wafer 10 is formed. Wafer 10 includes substrate 20, which may be formed of a semiconductor material such as silicon, silicon germanium, silicon carbon, a III-V compound semiconductor material, or the like. Substrate 20 may be a bulk substrate or a Semiconductor-On-Insulator (SOI) substrate.

A plurality of gate stacks 24A, 24B, 24B, 24C, 24D, 24E, and 24F, which are collectively referred to as gate stacks 24, are formed over substrate 20. In accordance with some embodiments of the present disclosure, gate stacks 24 are formed as gate stack strips (as shown in FIG. 1A) parallel to each other. Each of gate stacks 24 may include gate dielectric 26, gate electrode 28 over gate dielectric 26, and hard mask 38 over gate electrode 28. In accordance with some embodiments of the present disclosure, gate stacks 24 are replacement gate stacks, which are formed by forming dummy gate stacks (not shown), removing the dummy gate stacks to form recesses, and forming the replacement gate stacks in the recesses. As a result, each of gate dielectrics 26 includes a bottom portion underlying the respective gate electrode 28, and sidewall portions on the sidewalls of the respective gate electrode 28. The sidewall portions of gate dielectrics 26 form rings encircling the respective gate electrodes 28. When Fin Field Effect Transistors (FinFETs) are to be formed, the illustrated top portion of substrate 20 is a semiconductor fin, and gate stacks 24 extend on the sidewalls and the top surfaces of semiconductor fin 25.

In accordance with some embodiments of the present disclosure, source and drain regions 22 (referred to as source/drain regions hereinafter) are formed between neighboring gate stacks 24, and extend into substrate 20. Source/drain regions 22 may include epitaxy regions formed by recessing the original semiconductor substrate (or semiconductor fin) to form recesses, and re-growing a semiconductor material in the recesses. Accordingly, the top surfaces of source/drain regions 22 may be level with (as illustrated) or higher than the bottom surfaces of gate stacks 24. Some of the source/drain regions 22 may be common source regions or common drain regions, which are shared by neighboring gate stacks 24. Accordingly, gate stacks 24 may form transistors along with the source/drain regions on the opposite sides of the respective gate stacks 24.

Each of gate dielectrics 26 may be a single layer or a composite layer that includes a plurality of layers. For example, each of gate dielectrics 26 may include an interfacial oxide layer and a high-k dielectric layer over the oxide layer. The oxide layer may be a silicon oxide layer formed through thermal oxidation or chemical oxidation. The high-k dielectric layer may have a k value greater than 7, or greater than 20. Exemplary high-k dielectric materials include hafnium oxide, zirconium oxide, lanthanum oxide, and the like.

In accordance with some embodiments of the present disclosure, gate electrodes 28 are metal gates formed of metallic materials. For example, each gate electrode 28 may have a composite structure including a plurality of layers formed of TiN, TaSiN, WN, TiAl, TiAlN, TaC, TaN, aluminum, or alloys thereof. The formation of gate electrodes 28 may include Physical Vapor Deposition (PVD), Metal-Organic Chemical Vapor Deposition (MOCVD), and/or other applicable methods. Hard masks 38 may be formed of silicon nitride, for example.

In accordance with alternative embodiments of the present disclosure, rather than being replacement gate stacks, the formation of gate stacks 24 include forming a blanket gate dielectric layer and a blanket gate electrode layer (such as a polysilicon layer), and then patterning the blanket gate dielectric layer and the blanket gate electrode layer.

Referring again to FIG. 1B, Contact Etch Stop Layer (CESL) 34 is formed to cover substrate 20, and may extend on the sidewalls of gate spacers 30. In accordance with some embodiments of the present disclosure, CESL 34 is formed of silicon nitride, silicon carbide, or another dielectric material. Inter-Layer Dielectric (ILD) 36 is formed over CESL 34 and gate stacks 24. ILD 36 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. The formation may include, for example, Chemical Vapor Deposition (CVD), Flowable CVD (FCVD), spin-on coating, or the like.

Next, layers 40, 42, and 44 are formed over ILD 36. In accordance with some embodiments of the present disclosure, layer 40 is a metal hard mask layer, which may be formed of titanium nitride, for example. Layer 40 may have a thickness in the range between about 200 Å and about 400 Å. Layer 42 may be a Low-Temperature (LT) oxide layer, which is deposited at a low temperature, for example, lower than about 100° C. Layer 42 may include silicon oxide, for example. Layer 42 may have a thickness in the range between about 300 Å and about 600 Å. Layer 44 is deposited over layer 42, and may have a thickness between about 100 Å and about 300 Å. Layer 44 may be an amorphous silicon layer, and is referred to as amorphous silicon layer 44 hereinafter. Layer 44, however, may be formed of other materials. Layers 40, 42, and 44 may be formed using Chemical Vapor Deposition (CVD), Atomic Layer Deposition (ALD), or the like.

Figure 1C:
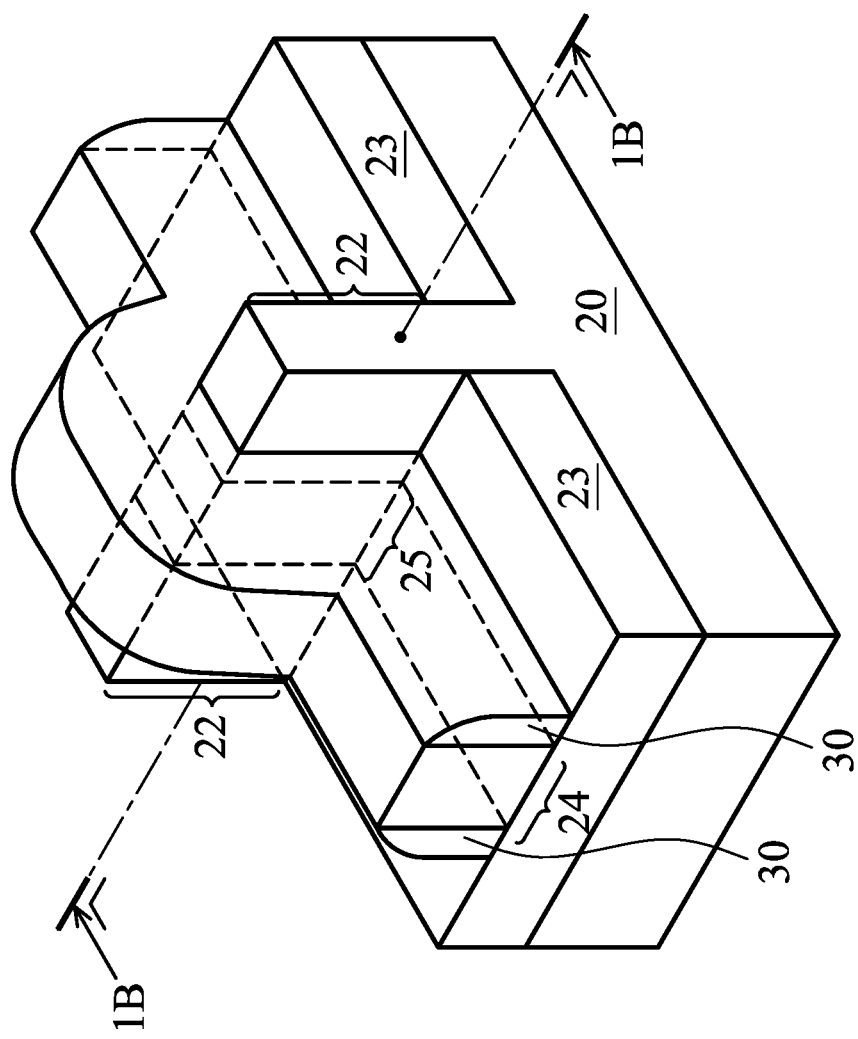
Figure 2A:
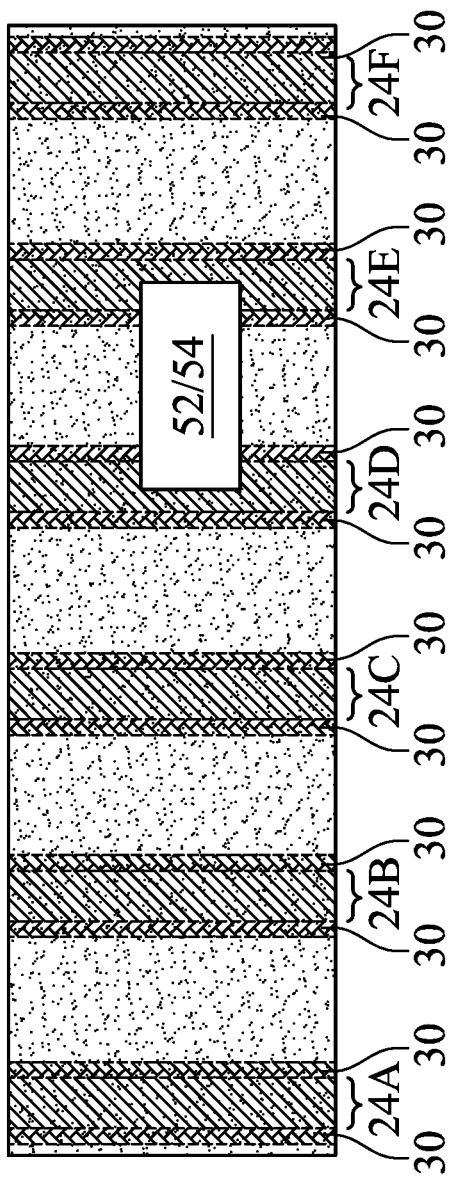
Figure 2B:
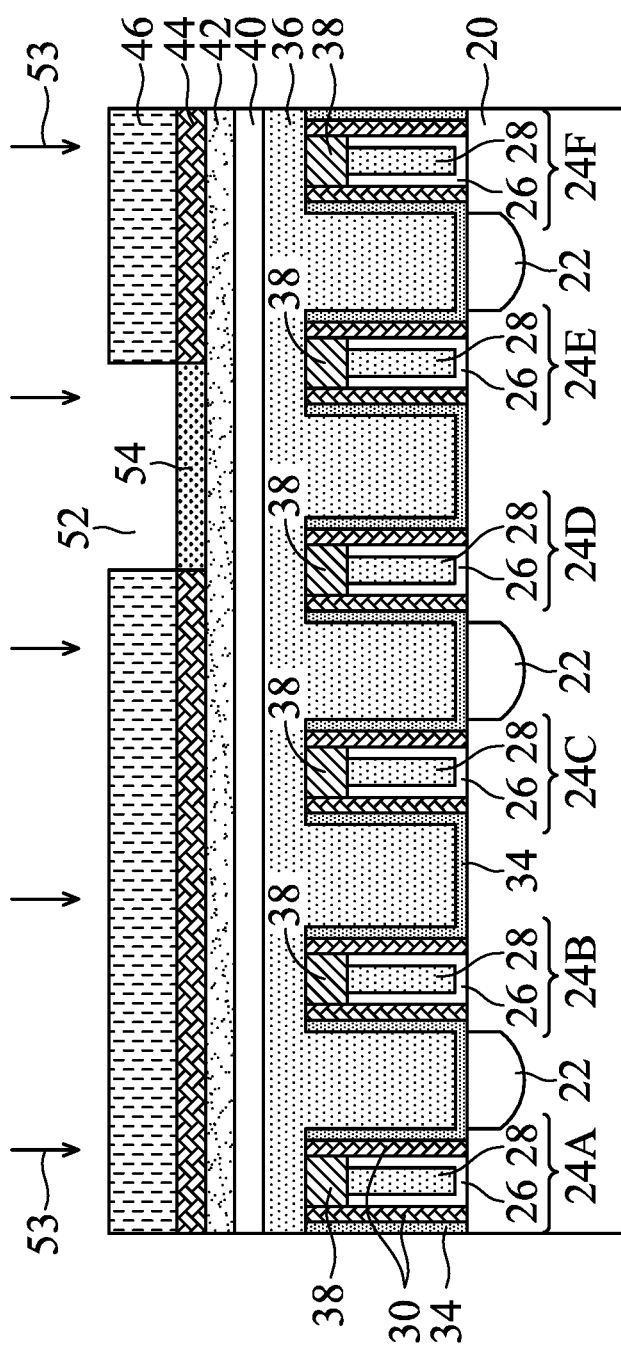

FIG. 1C illustrates a perspective view of a portion of a FinFET shown in FIGS. 1A and 1B in accordance with some embodiments, wherein one of the semiconductor fins 25 and one of gate stacks 24 are shown as examples. The FinFET includes gate stack 24, wherein the details of the gate stack 24 may be found referring to FIG. 1B. Source and drain regions 22 are formed on the opposite sides of gate stack 24. Gate stack 24 is formed on the sidewalls and the top surface of semiconductor fin 25, which protrudes higher than the top surfaces of Shallow Trench Isolation (STI) region 23. Semiconductor fin 25 may be a portion of semiconductor substrate 20, or an epitaxially grown semiconductor region. The ILD 36 as shown in FIG. 1B are not shown in FIG. 1C, and ILD 36 is formed over STI regions 23, gate stacks 24, gate spacers 30, and source drain regions 22. The cross-sectional view of gate stacks 24 in FIG. 1B may be obtained from the vertical plane containing line 1B-1B in FIG. 1C.

FIGS. 1A through 3B illustrate a first lithography and implantation process. A tri-layer is formed over amorphous silicon layer 44, which tri-layer includes bottom layer (also referred to as under layer) 46, middle layer 48 over bottom layer 46, and upper layer 50 over middle layer 48. In accordance with some embodiments, bottom layer 46 and upper layer 50 are formed of photo resists. Middle layer 48 may be formed of an inorganic material, which may be a carbide (such as silicon oxycarbide), a nitride (such as silicon nitride), an oxynitride (such as silicon oxynitride), an oxide (such as silicon oxide), or the like. Middle layer 48 has a high etching selectivity with relative to upper layer 50 and bottom layer 46, and hence upper layer 50 may be used as an etching mask for etching middle layer 48, and middle layer 48 may be used as an etching mask for etching bottom layer 46. Upper layer 50 is patterned to form opening 52.

As shown in FIG. 1A, the pattern of an exemplary opening 52 is illustrated. Opening 52 extends from gate stack 24D to gate stack 24E, and may overlap parts of gate stack 24D and gate stack 24E. The cross-sectional view shown in FIG. 1B is obtained from the plane containing line 1B-1B in FIG. 1A. In addition, the subsequently illustrated cross-sectional views are also obtained from the same plane.

Next, middle layer 48 is etched using the patterned upper layer 50 (FIG. 2) as an etching mask, so that the pattern of upper layer 50 is transferred into middle layer 48. During the patterning of middle layer 48, upper layer 50 is at least partially, or entirely, consumed. After middle layer 48 is etched through, bottom layer 46 is patterned, wherein middle layer 48 is used as an etching mask. Upper layer 50 will also be fully consumed during the patterning of bottom layer 46 if it has not been fully consumed in the patterning of middle layer 48. Opening 52 is thus formed in bottom layer 46.

A portion of amorphous silicon layer 44 is exposed to opening 52. Next, an implantation (53) is performed, wherein a dopant such as boron is doped into amorphous silicon layer 44, hence forming implanted region 54 in amorphous silicon layer 44. The respective process step is illustrated as step 202 in the process flow shown in FIG. 15. It is appreciated that layer 44 and the implanted dopant may be formed other materials other than amorphous silicon and boron, providing implanted region 54 has a high etching selectivity relative to the un-implanted portions of layer 44 in a subsequent etching step, as is discussed in subsequent paragraphs. In accordance with some embodiments, the implanted dopant reaches the bottom surface of amorphous silicon layer 44. Some, and not excessive, portion of the implanted dopant may further extend into layer 42.

Figure 3A:
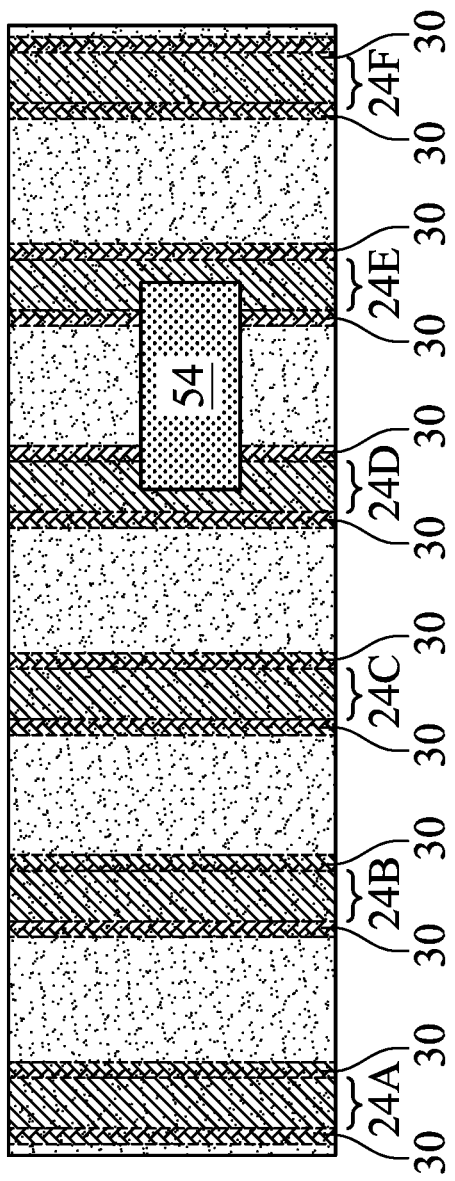
Figure 3B:
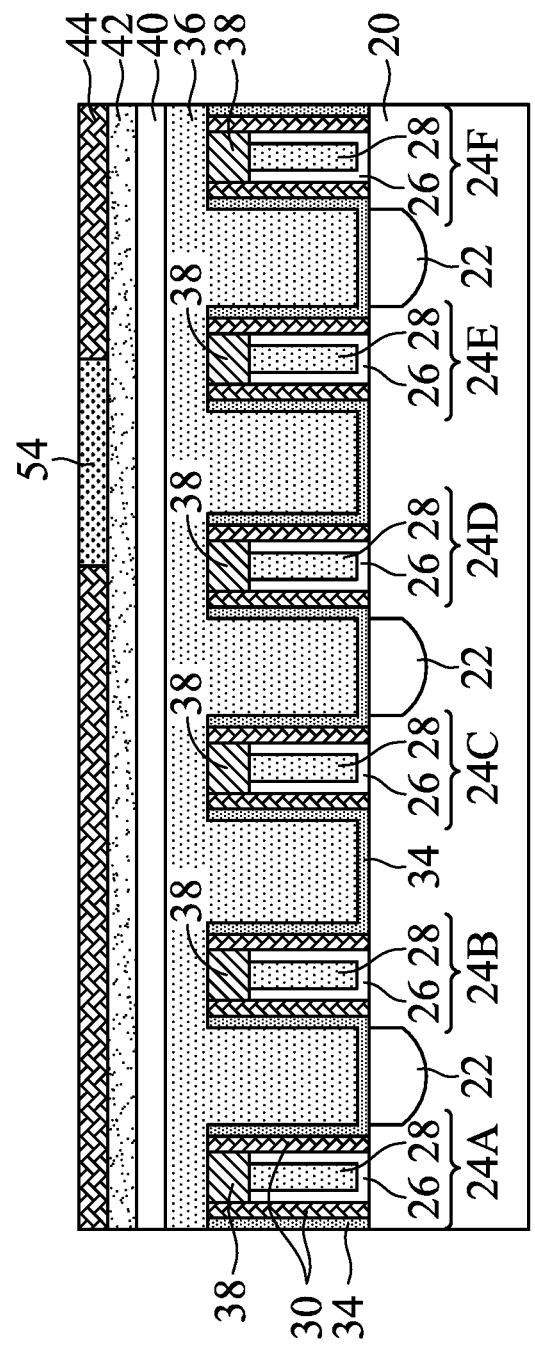
Figures 4A, 4B:
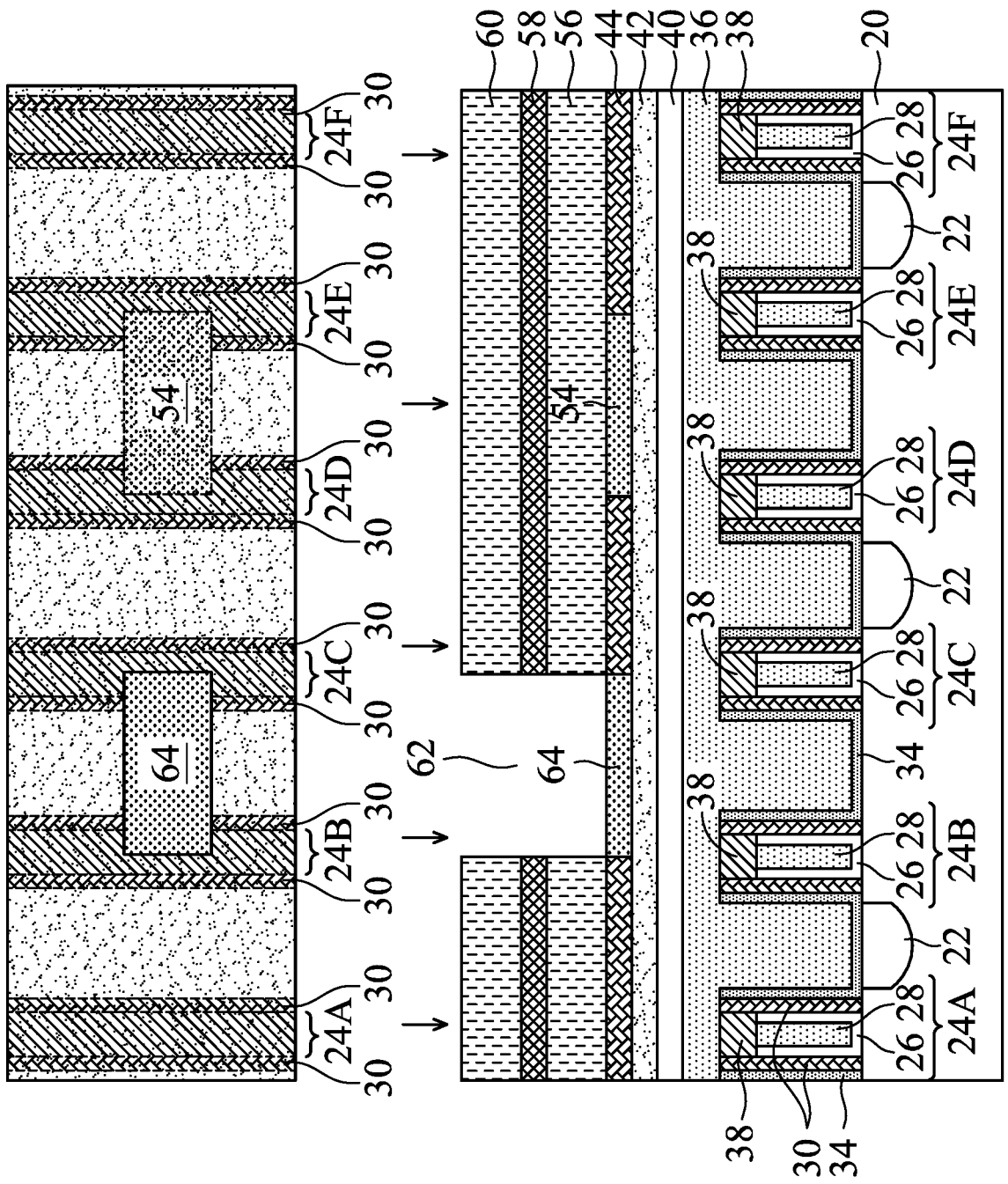

The remaining bottom layer 46 is then removed, for example, in an ashing process, leaving the structure as shown in FIGS. 3A and 3B, wherein un-implanted amorphous silicon layer 44 and implanted region 54 are illustrated. Next, as shown in FIGS. 4A through 5B, a second lithography and implantation process is performed to form a second implanted region. In accordance with some embodiments of the present disclosure, a second tri-layer is formed over amorphous silicon layer 44, as shown in FIG. 4B. The second tri-layer includes bottom layer 56, middle layer 58 over bottom layer 56, and upper layer 60 over middle layer 58. Opening 62 is formed in the patterned upper layer 60. The tri-layer as shown in FIG. 4B may have a similar structure and formed of similar material as the tri-layer shown in FIG. 2B. Middle layer 58 is etched using the patterned upper layer 60 as an etching mask, so that the pattern of upper layer 60 is transferred into middle layer 58, and then into bottom layer 56. In FIG. 4B, middle layer 58 and upper layer 60 are illustrated using dashed lines to indicate that at the time amorphous silicon layer 44 is exposed to opening 62, middle layer 58 and upper layer 60 may have been consumed.

Implanted region 64 is then formed in amorphous silicon layer 44 by implanting through opening 62. The respective process step is illustrated as step 204 in the process flow shown in FIG. 15. In accordance with some embodiments, implanted region 64 is formed by implanting the same dopant as for forming implanted region 54, wherein the implanted dopant may include boron in accordance with some embodiments of the present disclosure. Implanted region 64 may include a first portion overlapping a portion of gate stack 24B, a second portion overlapping a portion of gate stack 24C, and a third portion overlapping the portion of ILD between gate stack 24B and 24C.

Figure 5A:
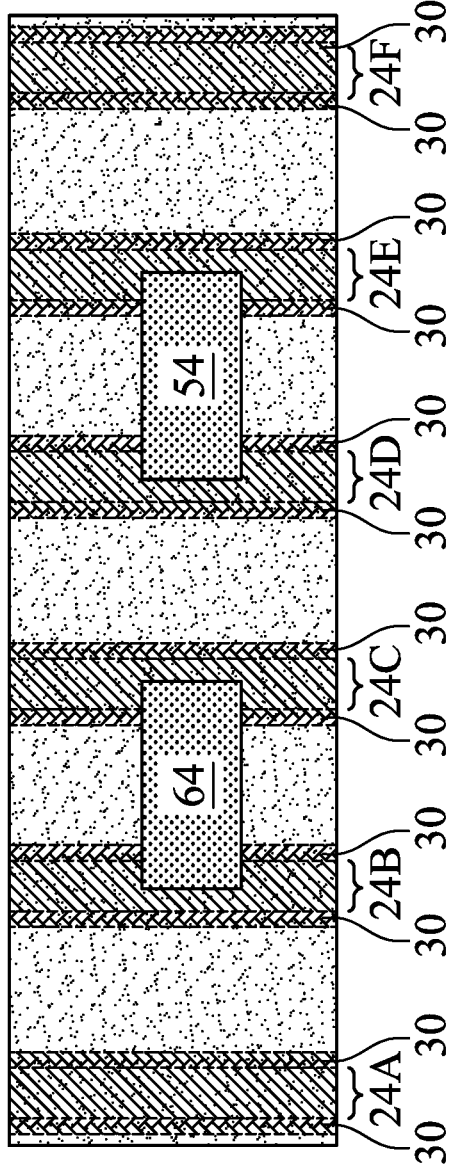
Figure 5B:
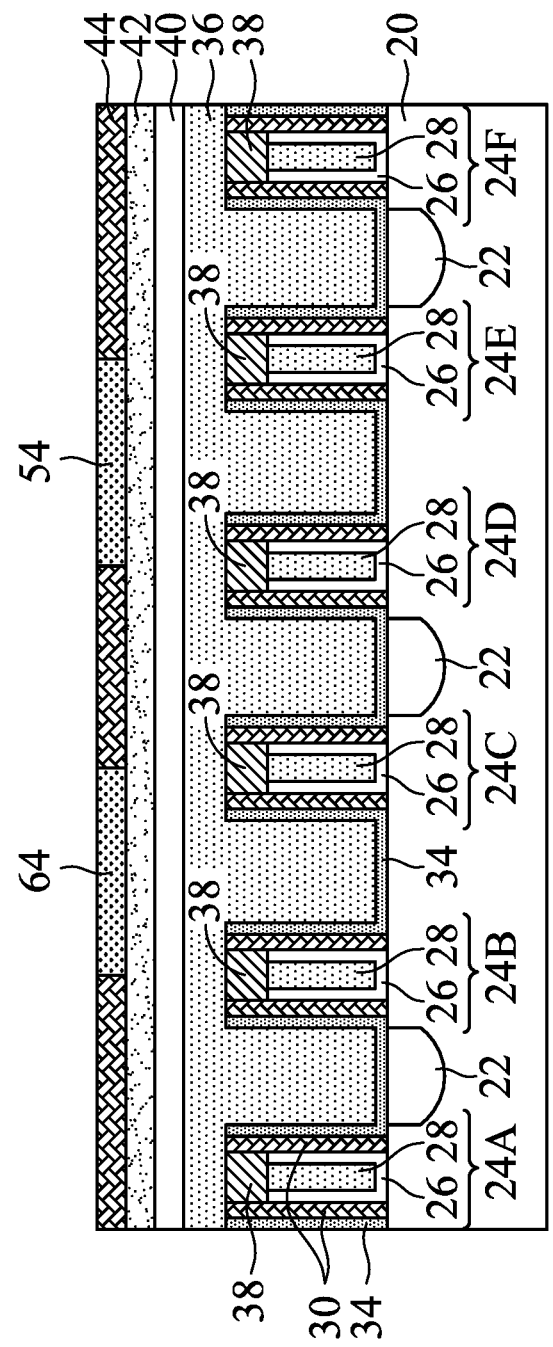

The remaining bottom layer 56 is then removed, and the resulting structure is shown in FIGS. 5A and 5B. Advantageously, the process steps shown in FIGS. 1A through 5B include two lithography processes, and hence the respective steps include double patterning processes. Accordingly, implanted regions 54 and 64 (FIGS. 5A and 5B) may be located close to each other without causing optical proximity effect. In accordance with alternative embodiments, implanted regions 54 and 64 are formed in a same lithography process.

Figure 6A:
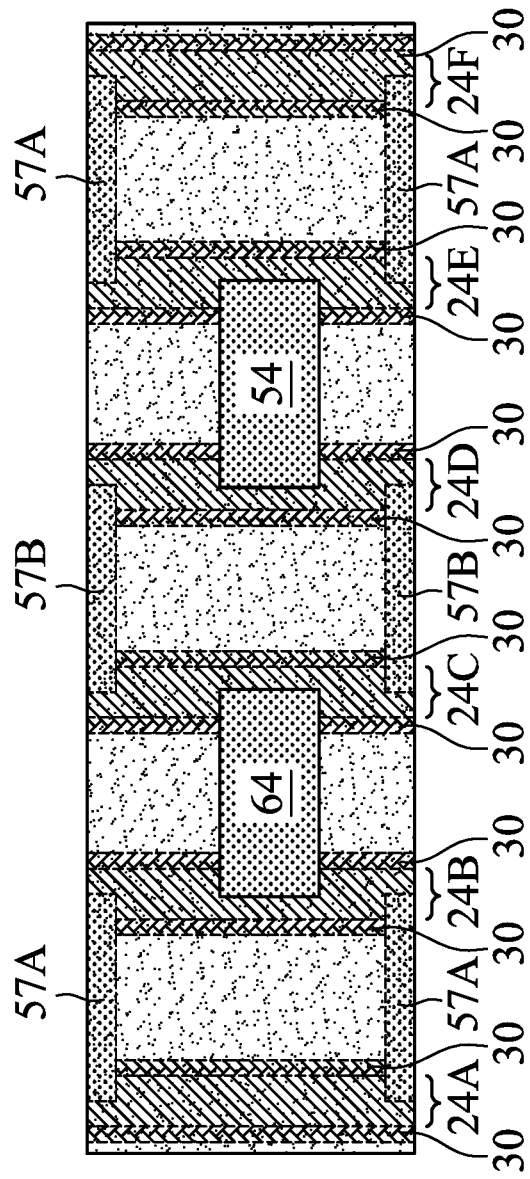
Figure 6B:
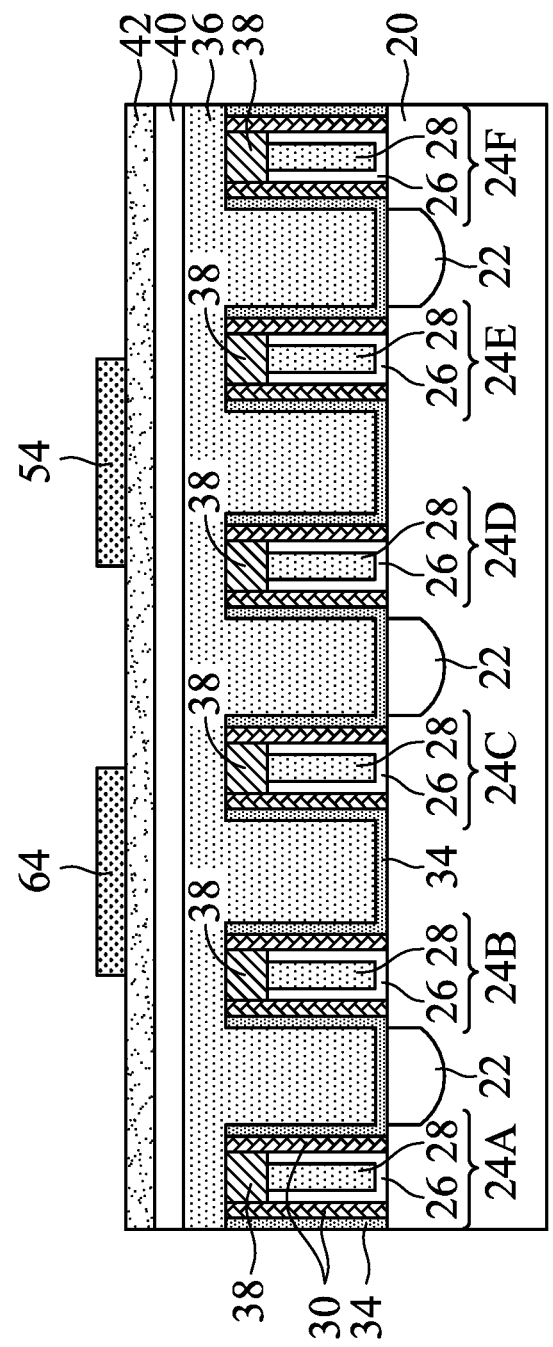

Next, an isotropic etching process is performed to remove the un-implanted portions of amorphous silicon layer 44, and leaving implanted regions 54 and 64 un-removed. The resulting structure is shown in FIGS. 6A and 6B. The respective process step is illustrated as step 206 in the process flow shown in FIG. 15. In accordance with some embodiments in which the implanted regions are doped with boron, the removal of the un-implanted portions of amorphous silicon layer 44 may be achieved using an ammonia solution including ammonia and water (with the chemical formula $NH_4OH$, also known as ammonium hydroxide). The boron-doped regions 54 and 64, with boron added, are resistant to the ammonium hydroxide. Accordingly, after the etching, the boron-doped regions 54 and 64 remain, while the un-implanted portions of amorphous silicon layer 44 are removed. The edges of the remaining implanted regions 54 and 64 may be substantially vertical.

As shown in FIGS. 6A and 6B, implanted regions 54 and 64 are located on a blanket layer 42. It is noted that although FIGS. 6A and 6B illustrates two implanted regions 54 and 64, there may be more implanted regions formed. For example, as schematically illustrated in FIG. 6A, additional implanted regions 57A and 57B may be formed. In accordance with some embodiments, implanted regions 57A may be formed simultaneously as implanted regions 54, and additional implanted regions 57B may be formed simultaneously as implanted regions 64. Implanted masks 57A and 57B and gate stacks 24 may have additional portions outside of the illustrated region. The locations of the additional implanted regions 57A and 57B are determined by the desirable lengths of the contact plugs to be formed.

Figures 7A, 7B:
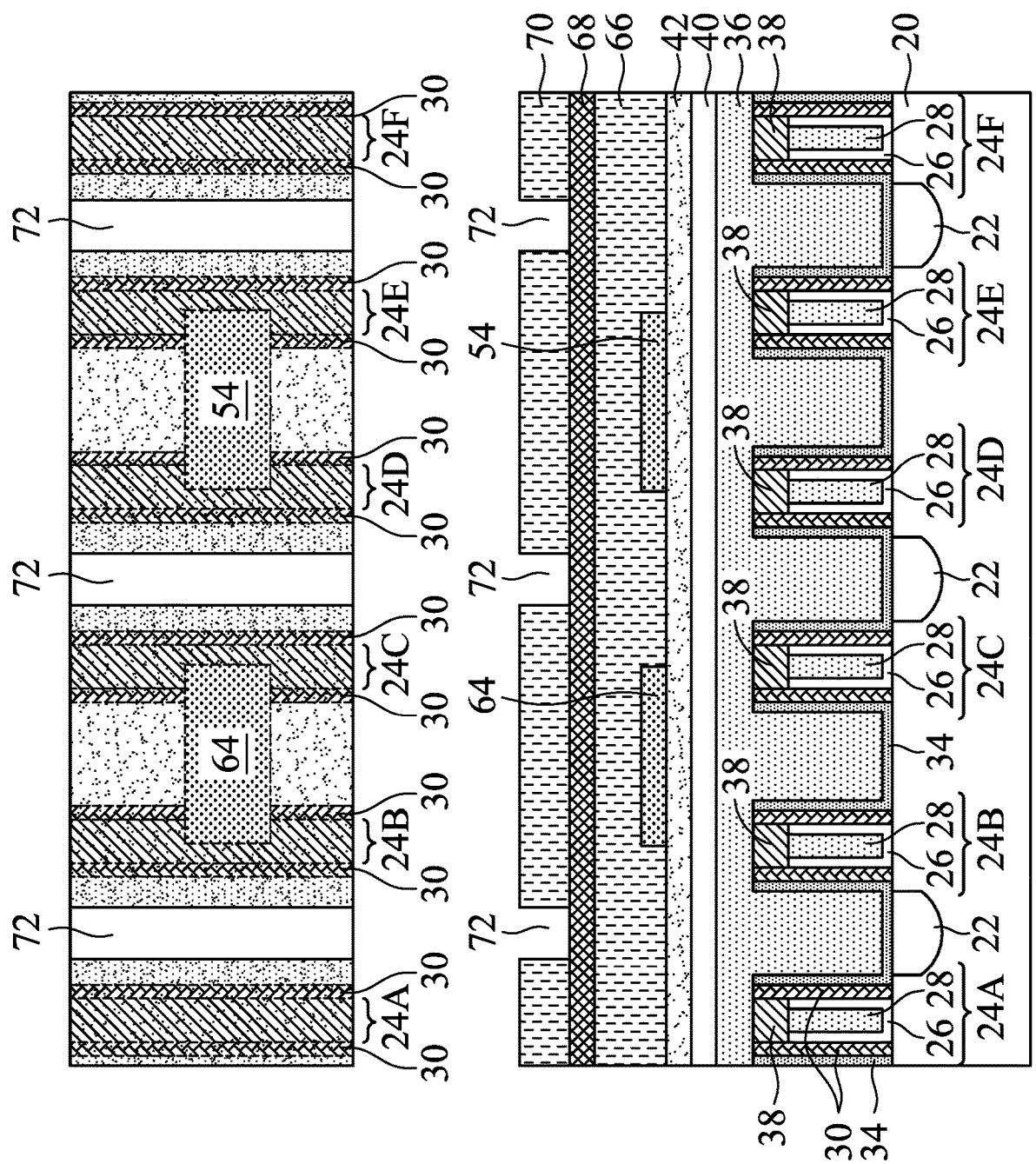

FIGS. 7A, 7B, 8A, and 8B illustrate a first pattern-formation process for forming the patterns of some contact plugs in layer 42. Accordingly, layer 42 is referred to as a pattern-reservation layer throughout the description. The respective process step is illustrated as step 208 in the process flow shown in FIG. 15. Referring to FIG. 7B, a tri-layer including bottom layer 66, middle layer 68, and upper layer 70 is formed to cover implanted regions 54 and 64. Upper layer 70 is patterned in a lithography process to form openings 72, and the patterns are then transferred into middle layer 68, and further into under layer 66. As shown in FIG. 7A, openings 72 may have strip-shapes, which may have a substantially uniform width in the top view shown in FIG. 7A. Furthermore, openings 72 overlap ILD 36, and don't overlap gate stacks 24. It is appreciated that although FIG. 7A doesn't show the openings 72 are over implanted regions, openings 72 may actually overlap, and may cross over, some of implanted regions such as regions 57A and 57B as shown in FIG. 6A in accordance with some embodiments.

Figure 8A:
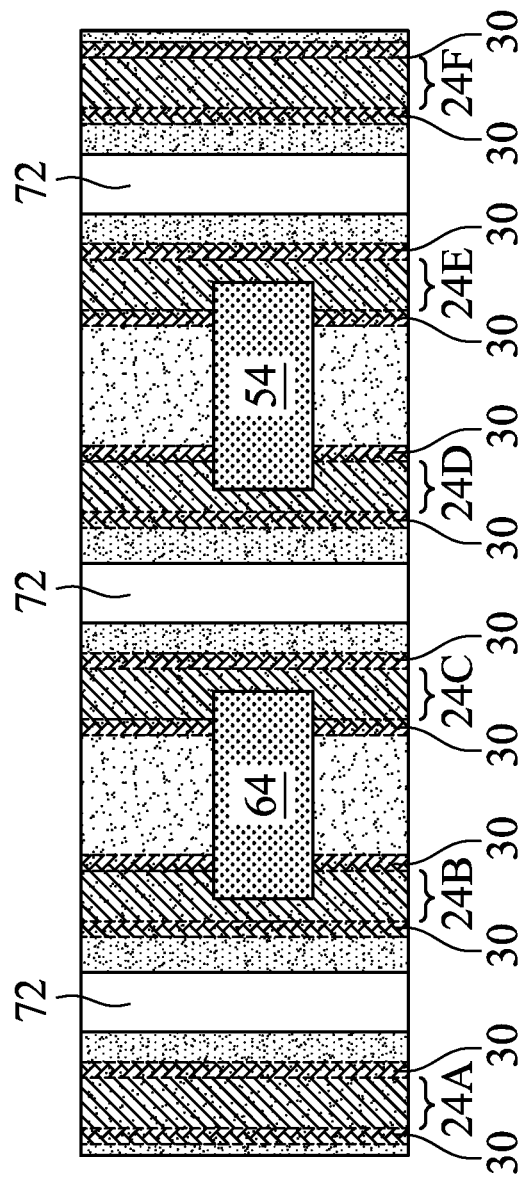
Figure 8B:
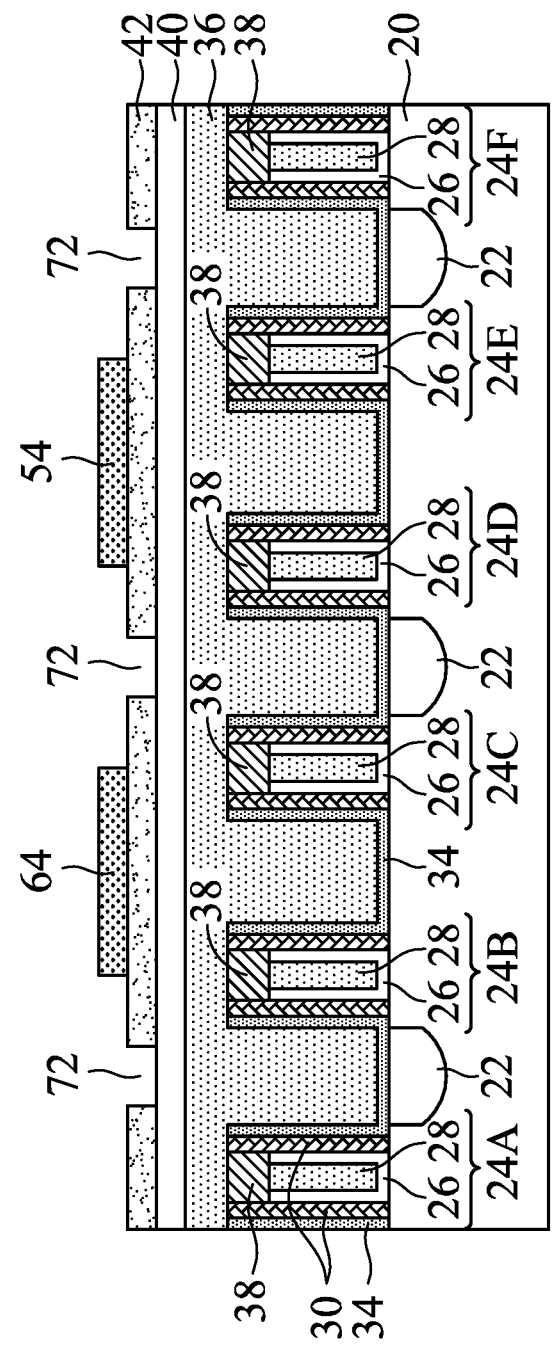

Next, referring to FIGS. 8A and 8B, layer 42 is etched using the tri-layer as shown in FIGS. 7A and 7B as an etching mask, and openings 72 extend into layer 42. If implanted regions 57A and 57B as shown in FIG. 6A are formed, implanted regions 57A and 57B will act as an etch stop layer to prevent openings 72 from extending into the portions of layer 42 directly underlying implanted region 57A and 57B. The etching may be performed using a fluorine-based etchant gas such as a combined gas of $NH_3$ (ammonia) and $HF_3$, which attacks layer 42 (such as silicon oxide), but does not attack boron-doped implanted amorphous silicon regions 54 and 64. After the etching, some portions of metal hard mask layer 40 are exposed. The remaining portion of the tri-layer is then removed.

FIGS. 9A, 9B, 10A, and 10B illustrate a second pattern formation process for forming the patterns of some contact plugs in layer 42. The respective process step is also illustrated as step 208 in the process flow shown in FIG. 15. Referring to FIG. 9B, a tri-layer including bottom layer 74, middle layer 76, and upper layer 78 is formed to cover implanted regions 54 and 64. Upper layer 78 is patterned in a lithography process to form openings 80. As shown in FIG. 9A, openings 80 may have strip-shapes, which may have substantially uniform widths in the top view show in FIG. 9A. Furthermore, openings 80 overlap ILD 36, and don't overlap gate stacks 24. Openings 80 may overlap portions of implanted regions 54 and 64. Furthermore, an opening 80 may include a first portion and a second portion on opposite sides of the respective implanted regions 54/64, and a third portion connecting the first portion to the second portion, wherein the third portion overlaps a portion of the respective implanted regions 54/64.

Figure 10A:
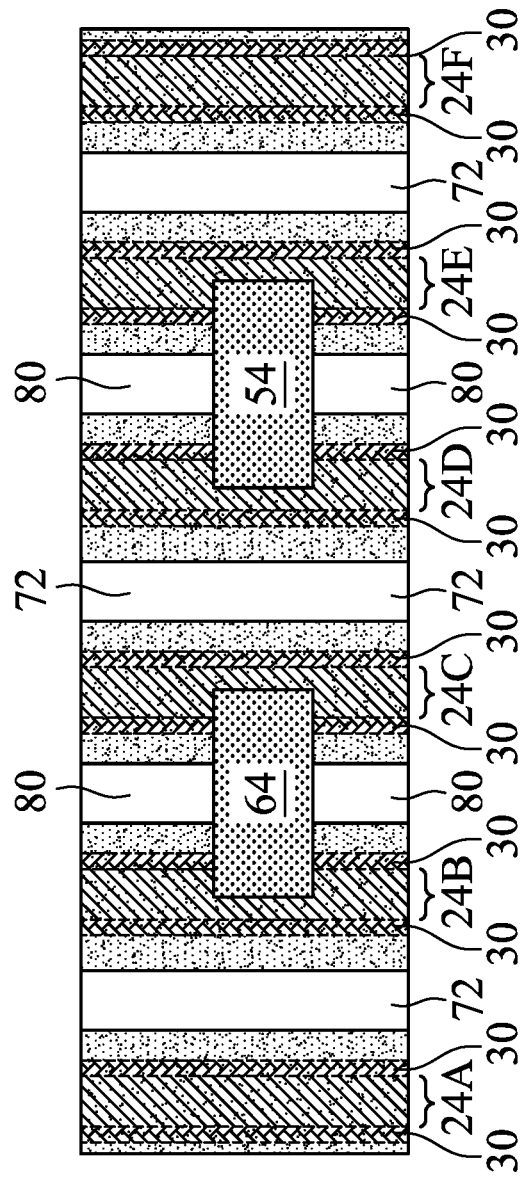
Figure 10B:
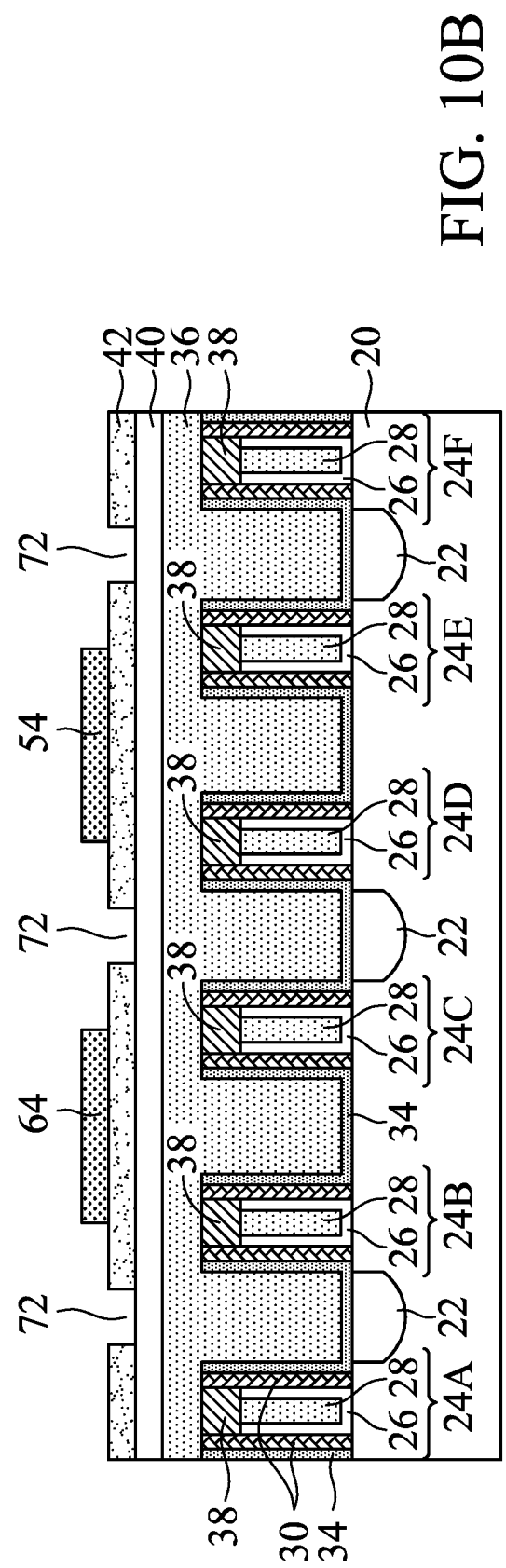

Next, referring to FIGS. 10A and 10B, layer 42 is further etched using the tri-layer as shown in FIGS. 9A and 9B as an etching mask, and openings 80 extend into layer 42. During the etching, implanted regions 54 and 64 act as an etch stop layer to prevent openings 80 from extending into the portions of layer 42 directly underlying implanted regions 54 and 64. Accordingly, as shown in FIG. 10A, two discrete openings 80 are formed on the opposite sides of implanted region 54, and two discrete openings 80 are formed on the opposite sides of implanted region 64. The etching may also be performed using the same fluorine-based etchant gas as for forming openings 72. After the etching, metal hard mask layer 40 is exposed to openings 80. The remaining portions of the tri-layer as shown in FIG. 9B are removed.

As shown in FIGS. 7A through 11B, layer 42 is used to reserve the patterns (of openings 72 and 80) formed in two lithography processes. In addition, the formation of implanted regions 54 and 64 cuts the otherwise long strip-shaped (viewed in the top view) openings 72 and 80 into shorter strips.

Figure 11A:
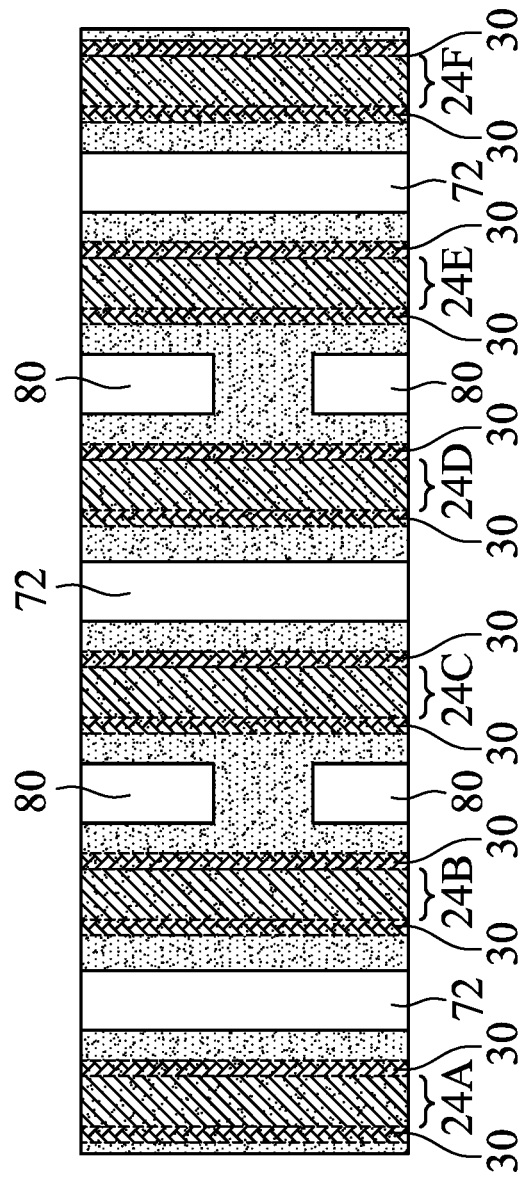
Figure 11B:
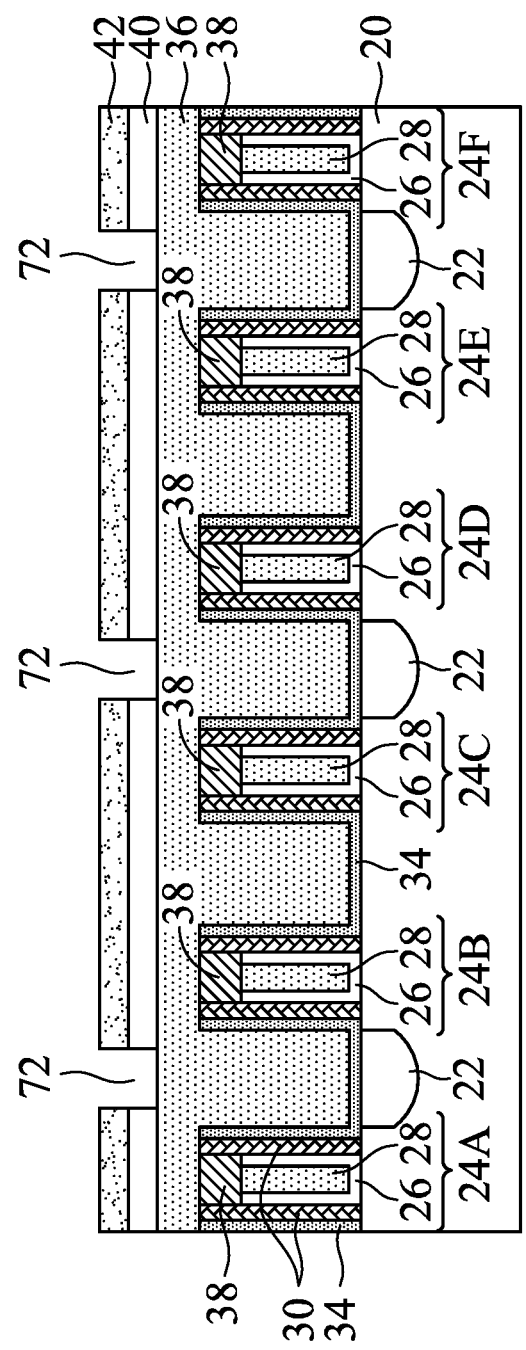

In a subsequent step, implanted regions 54 and 64 are removed in an etching step. The etching may be isotropic or anisotropic, and may be performed using wet etch or dry etch. In accordance with some embodiments of the present disclosure, the etching is performed using a chlorine-containing process gas including $Cl_2$, for example. The resulting structure is shown in FIGS. 11A and 11B. In a subsequent step, as also shown in FIGS. 11A and 11B, layer 42 is used as an etching mask to etch the underlying metal hard mask 40, so that openings 72 and 80 extend into metal hard mask layer 40. The respective process step is illustrated as step 210 in the process flow shown in FIG. 15.

Figure 12A:
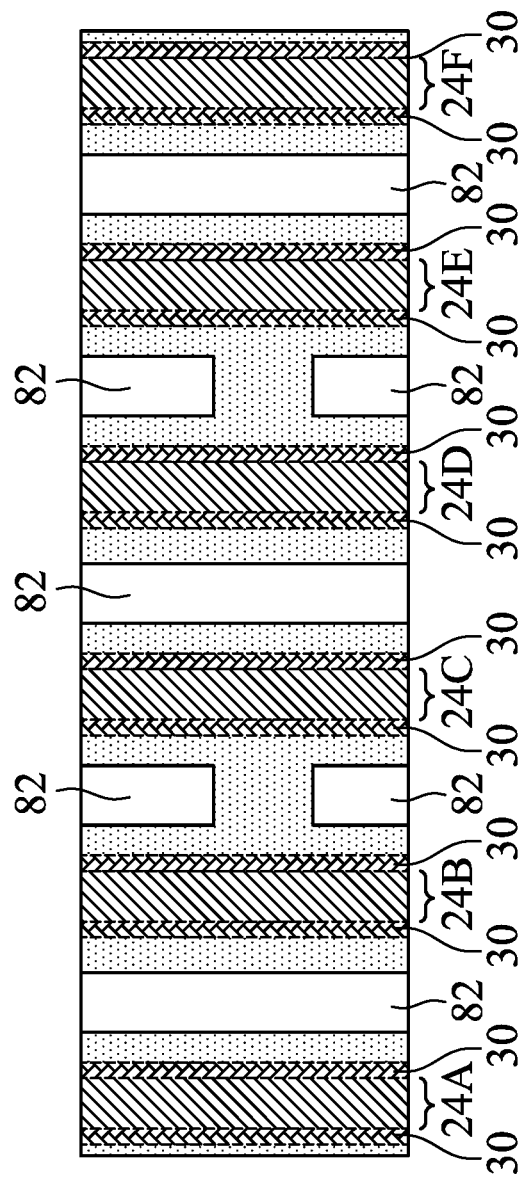
Figure 12B:
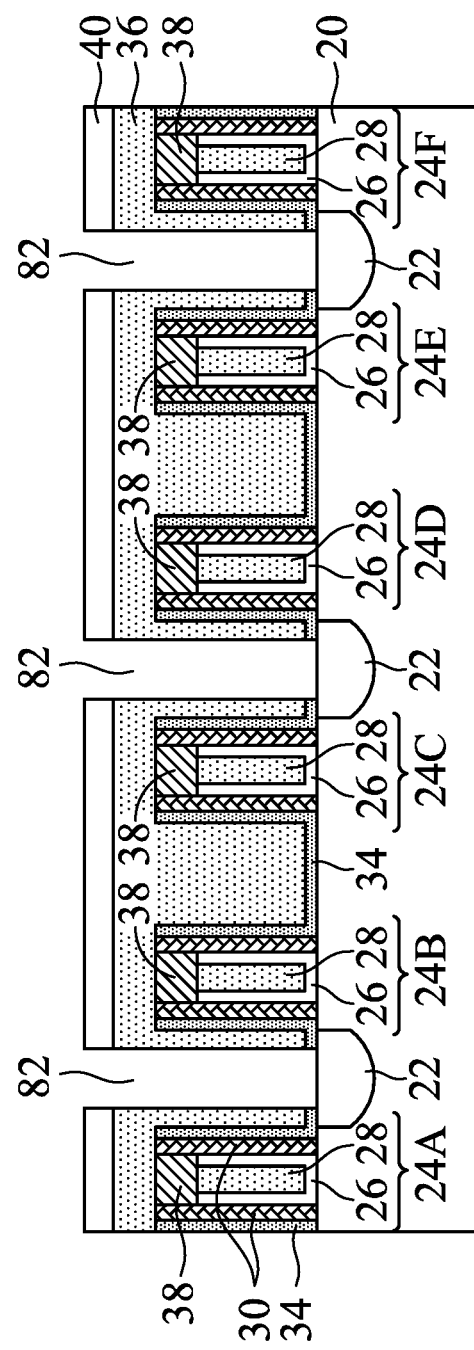

Next, the patterned layer 42 and layer 40 are used as an etching mask to etch the underlying ILD 36. The resulting structure is shown in FIGS. 12A and 12B, wherein contact openings 82 are formed. The respective process step is illustrated as step 212 in the process flow shown in FIG. 15. In accordance with some embodiments of the present disclosure, layer 42 and ILD 36 are formed of materials have similar etching properties, and hence have a low etching selectivity. During the etching, layer 42 is fully consumed, and metal hard mask 42 is used as the etching mask. CESL 34 is also etched through. As a result, source/drain regions 22 are exposed to contact openings 82.

Figure 13A:
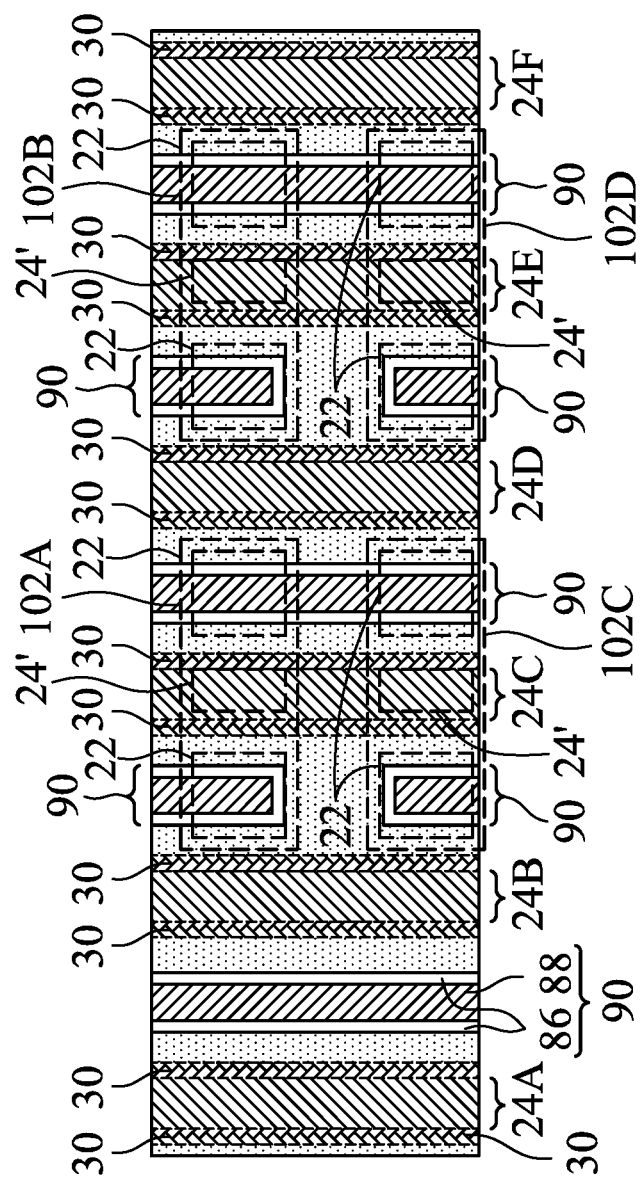
Figure 13B:
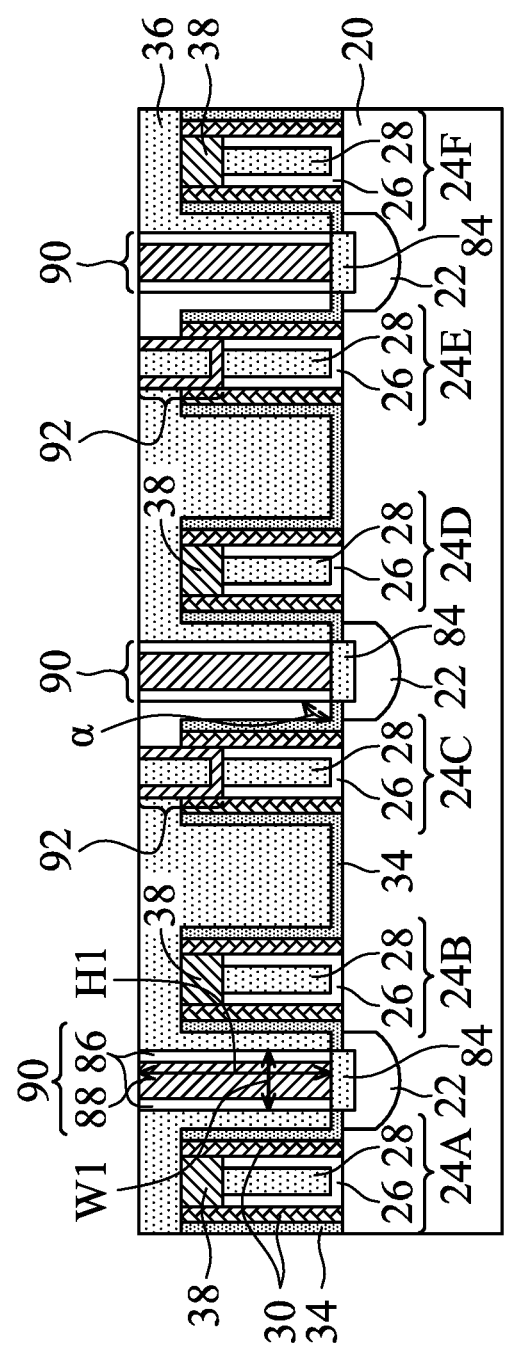

FIGS. 13A and 13B illustrate the top view and the cross-sectional view in the formation of source/drain silicide regions 84 and contact plugs 90. Referring to FIG. 13B, metal layer 86 is deposited as a conformal metal layer, which extends into contact openings 82 (FIGS. 12A and 12B). Metal layer 86 may be formed of titanium, for example. Next, an anneal is performed, so that the portions of metal layer 86 located at the bottoms of contact openings 82 react with source/drain regions 22 to form source/drain silicide regions 84. The respective process step is illustrated as step 214 in the process flow shown in FIG. 15. In accordance with some embodiments, an additional conductive nitride layer (not shown) such as titanium nitride may be formed on metal layer 86 before the anneal. As shown in FIG. 12B, the sidewall portions of metal layer 86 are left after the anneal. The remaining contact openings are then filled with metallic material 88, which may be formed of tungsten, copper, aluminum, or alloys thereof. A planarization such as CMP is then performed to level the top surfaces of the resulting contact plugs 90, which include metal layer 86 and metallic material 88. The respective process step is illustrated as step 216 in the process flow shown in FIG. 15.

In accordance with some embodiments of the present disclosure, by cutting long gate contact plugs into short contact plugs, the heights H1 (FIG. 13B) of contact plugs 90 are uniform regardless of the widths W1 of contact plugs 90. Experiment results obtained from wafers revealed that the heights of three sample contact plugs 90 may be essentially the same although the widths of the sample contact plugs 90 are equal to 67.54 nm, 38.13 nm, and 145.52 nm, which are significantly different from each other. The ratios of the heights of any two contact plugs 90 throughout a wafer can be controlled in the range between 0.9 and 1.2. The tilt angle α of the sidewall of contact plug 90 is found to be smaller than about 85 degrees, wherein the smaller tilt angle α is beneficial for filling trenches 82 (FIG. 12B) in order to form contact plugs 90.

Figure 14:
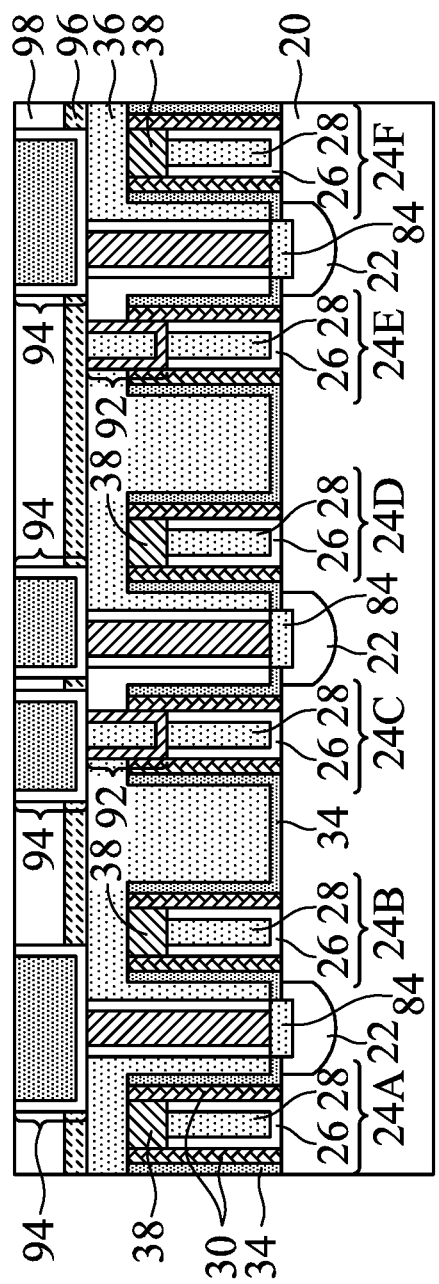
Figure 15:
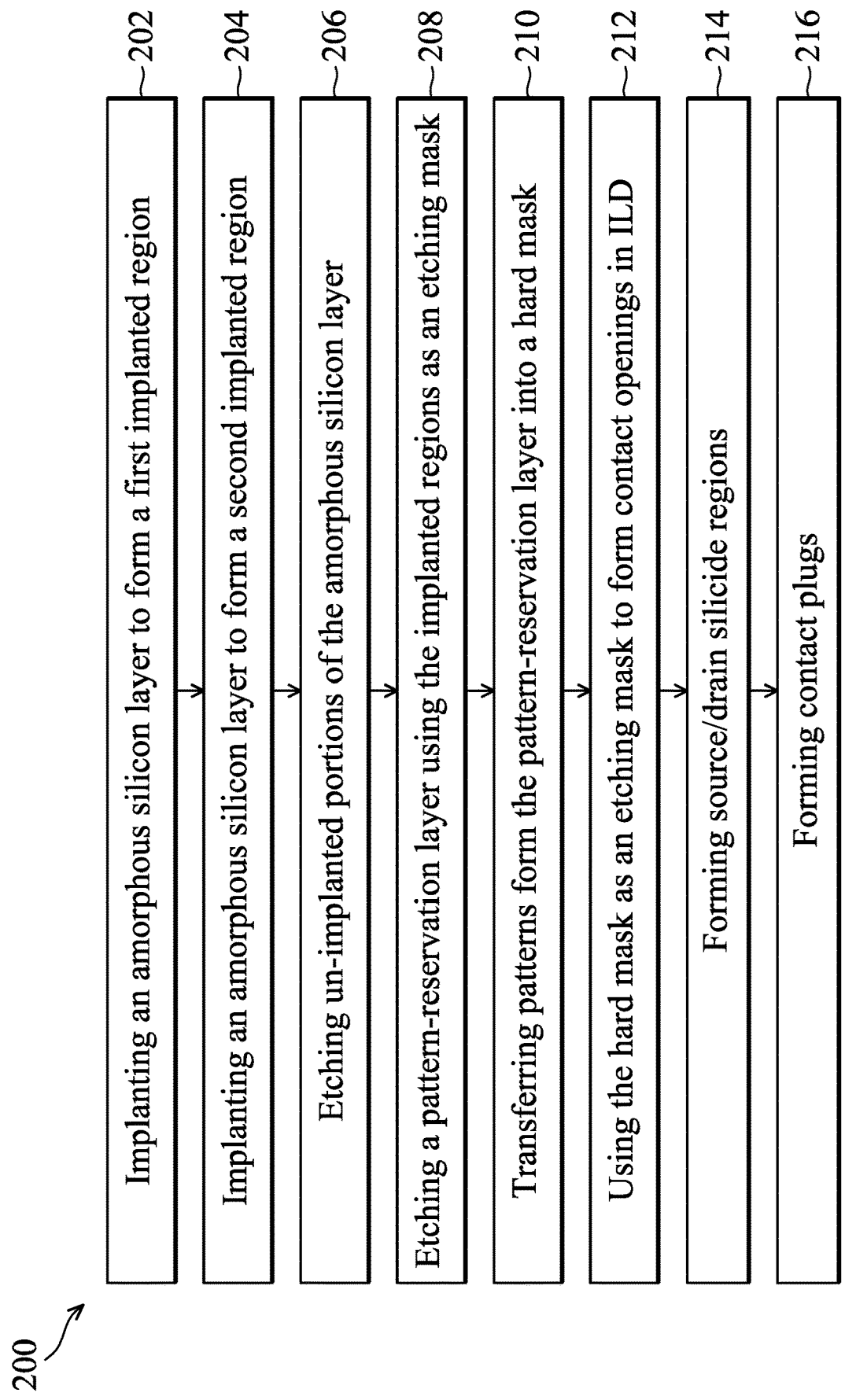
FIG. 15 illustrates a process flow for forming contact plugs in accordance with some embodiments.

FIG. 13B also illustrates the processes for forming gate contact plugs 92, and FIG. 14 illustrates the processes for forming upper contact plugs 94 in accordance with some embodiments of the present disclosure. The respective process steps are also illustrated as step 216 in the process flow shown in FIG. 15. In accordance with some embodiments, an etch is performed to etch ILD 36 and some portions of hard masks 38 (FIG. 13B) to form gate contact openings, in which gate contact plugs 92 are formed, for example, through deposition and CMP. Next, etch stop layer 96 and dielectric layer 98 are formed. Contact plugs (or vias) 94 are then formed in dielectric layer 98 to connect to gate contact plugs 92 and source/drain contact plugs 90. In accordance with alternative embodiments of the present disclosure, etch stop layer 96 is not formed, and ILD 98 is in contact with ILD 36. It is noted that the features illustrated in FIG. 14 may not be in the same plane, although they are shown in the same plane. For example, gate contact plugs 92 may be formed in a plane different from the illustrated plane.

Referring back to FIG. 13A, a plurality of transistors 102 (including 102A, 102B, 102C, and 102D) is schematically marked, wherein the source/drain regions 22 and the respective gates 24' are annotated. Contact plugs 90 may act as the interconnection for interconnecting the source/drain regions 22 of some transistors to the source/drain regions 22 of neighboring transistors.

The embodiments of the present disclosure have some advantageous features. By forming implanted regions, patterns are formed in the metal hard mask, so that the otherwise long gate contact plugs are cut into short contact plugs. Accordingly, the patterns of the implanted regions are referred to as cut lines. Using the implanted regions to form cut-line patterns on the metal hard mask is advantageous over directly etching the metal hard mask to form cut-line patterns since less rounding occurs at the end of the contact plugs when the implanted regions are used to form cut-line patterns.

In accordance with some embodiments of the present disclosure, a method includes performing an implantation on a portion of a first layer to form an implanted region, and removing un-implanted portions of the first layer. The implanted region remains after the un-implanted portions of the first layer are removed. An etching is then performed on a second layer underlying the first layer, wherein the implanted region is used as a portion of a first etching mask in the etching. The implanted region is removed. A metal hard mask is etched using the second layer to form a patterned hard mask. An inter-layer dielectric is then etched to form a contact opening, wherein the patterned hard mask is used as a second etching mask.

In accordance with some embodiments of the present disclosure, a method includes depositing an oxide layer over a metal hard mask, depositing an amorphous silicon layer over the oxide layer, implanting boron into the amorphous silicon layer to form a boron-doped region, removing un-implanted portions of the amorphous silicon layer, and forming a patterned photo resist over the boron-doped region. The patterned photo resist has an opening, wherein a middle portion of the boron-doped region is exposed to the opening, and portions of the oxide layer are exposed to the opening. The method further includes etching the exposed portions of the oxide layer, with the middle portion of the boron-doped region protecting a portion of the oxide layer, removing the patterned photo resist, removing the boron-doped region, etching the metal hard mask using the oxide layer as a first etching mask, and etching an inter-layer dielectric to form a contact opening, wherein the metal hard mask is used as a second etching mask.

In accordance with some embodiments of the present disclosure, a method includes forming an oxide layer over a metal hard mask, forming an amorphous silicon layer over the oxide layer, implanting boron into the amorphous silicon layer to form a boron-doped region, forming a patterned photo resist over the boron-doped region, etching the oxide layer using the boron-doped region and the patterned photo resist in combination as an etching mask, and transferring patterns in the etched oxide layer into the metal hard mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    performing a first implantation on a portion of a first layer to form a first implanted region, wherein the first implanted region comprises:
        a first portion overlapping a portion of a first gate stack;
        a second portion overlapping a portion of a second gate stack; and
        a third portion connecting the first portion of the first implanted region to the second portion of the first implanted region;
    removing un-implanted portions of the first layer, wherein the first implanted region remains after the removing;
    performing a first etching on a second layer underlying the first layer, wherein the first implanted region is used as a portion of a first etching mask in the first etching; and
    removing the first implanted region.

2. The method of claim 1, wherein the first etching results in a first opening and a second opening to be formed in the second layer, and in a top view of the first implanted region, the first opening and the second opening are on opposite sides of the first implanted region.

3. The method of claim 2 further comprising:
    after the un-implanted portions of the first layer are removed, applying a photo resist over the first implanted region; and
    forming a trench in the photo resist, wherein the trench comprises a first portion overlapping a portion of the first implanted region, and a second portion and a third portion on opposite side of the first portion, and in the first etching, the photo resist and the first implanted region are in combination used as the first etching mask.

4. The method of claim 1, wherein the first layer comprises an amorphous silicon layer, and the first implantation comprises implanting boron into the amorphous silicon layer.

5. The method of claim 1, wherein the second layer is formed of a material different from a material of the first layer, and the first etching stops after the second layer is penetrated through.

6. The method of claim 5 further comprising performing a second implantation on an additional portion of the first layer to form a second implanted region, wherein the first implantation and the second implantation are performed using different implantation masks, and wherein the second implanted region remains after the un-implanted portions of the first layer are removed.

7. The method of claim 6, wherein the method further comprises:
    performing a second etching on a third layer underlying the second layer, with the first implanted region and the second implanted region used as parts of a second etching mask.

8. The method of claim 1, wherein the first implanted region has a strip shape with a uniform width, and the first portion, the second portion, and the third portion have the uniform width.

9. A method comprising:
    depositing an amorphous silicon layer;
    implanting boron into the amorphous silicon layer to form a boron-doped region;
    removing un-implanted portions of the amorphous silicon layer;
    forming a patterned photo resist over the boron-doped region, wherein the patterned photo resist comprises an opening, wherein a portion of the boron-doped region is revealed through the opening, and a mask layer underlying the boron-doped region have a first portion covered by the portion of the boron-doped region, and second portions exposed to the opening;
    etching the second portions of the mask layer; and
    transferring openings in the mask layer into an underlying inter-layer dielectric to form contact openings.

10. The method of claim 9 further comprising implanting boron into the amorphous silicon layer to form an additional boron-doped region, wherein the additional boron-doped region and the boron-doped region are implanted in separate implantation steps.

11. The method of claim 9, wherein the transferring openings in the mask layer into the underlying inter-layer dielectric comprises:
    etching a metal hard mask layer underlying the mask layer, wherein the mask layer is used as an etching mask; and
    etching the underlying inter-layer dielectric using the metal hard mask layer as an additional etching mask.

12. The method of claim 9 further comprising removing the boron-doped region before the openings in the mask layer are transferred into the inter-layer dielectric.

13. The method of claim 12, wherein the un-implanted portions of the amorphous silicon layer are removed using ammonium hydroxide as an etchant.

14. The method of claim 9, wherein the mask layer comprises an oxide, and the second portions of the mask layer are etched using a chlorine-containing process gas.

15. The method of claim 9 further comprising:
    forming silicide regions at bottoms of the contact openings; and
    filling the contact openings with a metallic material to form contact plugs.

16. The method of claim 9, wherein the boron-doped region comprises:
    a first portion overlapping a portion of a first gate stack;

a second portion overlapping a portion of a second gate stack; and a third portion connecting the first portion of the boron-doped region to the second portion of the boron-doped region.

17. A method comprising:

depositing a mask layer;

depositing an amorphous silicon layer over the mask layer;

implanting the amorphous silicon layer with an element to form an implanted region;

removing un-implanted portions of the amorphous silicon layer;

etching the mask layer using the implanted region as a part of an etching mask to form openings in the mask layer, wherein the implanted region protects a first portion of the mask layer, and second portions of the mask layer on opposite sides of the first portion are etched; and transferring patterns in the etched mask layer into an underlying layer, wherein the transferring the patterns comprises etching a metal hard mask layer underlying the mask layer.

18. The method of claim 17 further comprising:

etching an inter-layer dielectric using the etched metal hard mask layer as an etching mask to form contact openings; and filling the openings with conductive materials to form contact plugs.

19. The method of claim 17, wherein the removing the un-implanted portions of the amorphous silicon layer is performed using ammonium hydroxide.

20. The method of claim 17 further comprising forming contact plugs in the underlying layer.

* * * * *